(12) United States Patent
Sakamoto et al.

(10) Patent No.: US 7,019,362 B2
(45) Date of Patent: Mar. 28, 2006

(54) POWER MOSFET WITH REDUCED DGATE RESISTANCE

(75) Inventors: Kozo Sakamoto, Hitachinaka (JP); Takayuki Iwasaki, Hitachi (JP); Masaki Shiraishi, Hitachi (JP)

(73) Assignee: Renesas Technology, Corp., Tokyo (JP)

( * ) Notice: Subject to any disclaimer, the term of this patent is extended or adjusted under 35 U.S.C. 154(b) by 0 days.

(21) Appl. No.: 10/781,704

(22) Filed: Feb. 20, 2004

(65) Prior Publication Data

US 2004/0227163 A1 Nov. 18, 2004

(30) Foreign Application Priority Data

Feb. 27, 2003 (JP) .............................. 2003-050229

(51) Int. Cl.
*H01L 29/76* (2006.01)
(52) U.S. Cl. ...................... 257/341; 257/401; 257/327; 257/335; 438/284; 438/286
(58) Field of Classification Search ................ 257/341, 257/213, 288, 327, 335, 368, 369, 401; 438/284, 438/286
See application file for complete search history.

(56) References Cited

U.S. PATENT DOCUMENTS 6,278,264 B1 * 8/2001 Burstein et al. ............ 323/282

* cited by examiner

*Primary Examiner*—Evan Pert
*Assistant Examiner*—Scott R. Wilson
(74) *Attorney, Agent, or Firm*—Dickstein Shapiro Morin & Oshinsky LLP

(57) ABSTRACT

The gate resistance of a power MOSFET in a semiconductor chip is reduced and the reliability and yield of the gate of the power MOSFET are improved The semiconductor chip includes two or more control electrode pads functioning as control electrodes for a power semiconductor device formed within a semiconductor chip. The two or more control electrode pads are distributed within the periphery of the gate area of the power semiconductor device such that the gate resistance of the power semiconductor device can be reduced. The two or more control electrode pads are connected via bumps or a conductive bonding material to an electrode layer of a multilayer circuit board disposed outside the semiconductor chip.

13 Claims, 11 Drawing Sheets

POWER MOSFET WITH REDUCED DGATE RESISTANCE

This application is based on the Japanese patent application, 2003-050229, filed on Feb. 27, 2003, all the contents of which is incorporated in this application by reference.

BACKGROUND OF THE INVENTION

1. Technical Field

The present invention relates to a power semiconductor device and a circuit system using the same.

2. Background Art

Patent Document 1 indicated below discloses a switching regulator employing a flip-chip type package in which a multilayer circuit board and an integrated circuit chip are connected via bumps in order to reduce on-resistance of the semiconductor device.

(Patent Document 1)

U.S. Pat. No. 6,278,264

SUMMARY OF THE INVENTION

In Patent Document 1, however, no analysis is carried out with regard to how to reduce gate impedance in order to reduce the switching-loss components in a power MOSFET that are caused by delay due to the gate resistance.

Further, in Patent Document 1, no consideration is given to the reducing of resistance in gate layers that are provided throughout the power MOSFET region. While the gate resistance can be reduced by a gate finger structure utilizing an aluminum layer used for the source electrode in a power MOSFET, since aluminum has sheet resistance on the order of 7 milliohms per square even at a thickness of 5 µm, the aluminum wiring resistance increases by 2 Ω for every 3 mm extension, even at a width of 10 µm. Thus, in the case where the gate finger is extended to a gate pad located at a distance, it would not be easy to obtain a gate resistance of 0.5 Ω or less by depending only on methods utilizing conventional gate fingers, unless the thickness of the aluminum is increased to several hundred micrometers or more. In methods utilizing metal gate electrodes, it is difficult to ensure reliability in gate oxide films. In methods whereby a polycrystalline silicon gate electrode is silicided, the sheet resistance is on the order of several ohms per square, and therefore no significant reduction in gate resistance can be expected.

It is the object of the invention to reduce the gate resistance in a power semiconductor device and to improve reliability and yield of the gate in power MOSFETs.

The invention provides a semiconductor device comprising two or more control electrode pads functioning as control electrodes for a power semiconductor device formed within a semiconductor chip. The two or more control electrode pads are distributed within the periphery of the gate area such that the gate resistance of the power semiconductor device can be reduced. The two or more control electrode pads are connected via bumps or a conductive bonding material to an electrode layer disposed outside the semiconductor chip.

DESCRIPTION OF THE PREFERRED EMBODIMENTS

Figure 1:
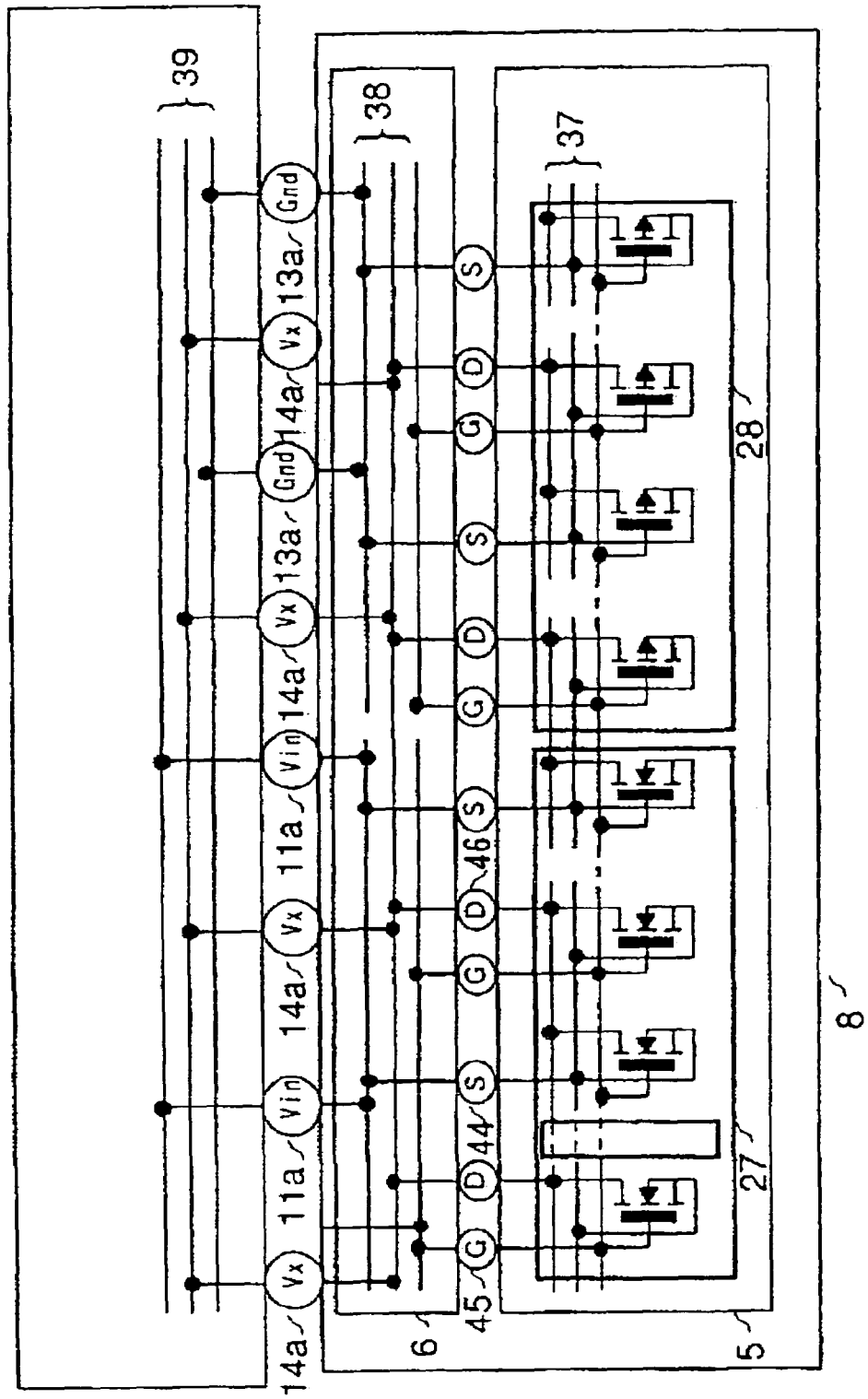
FIG. 1 shows a cross-sectional illustration view of a power semiconductor device according to Embodiment 1.

The semiconductor device according to the invention will be hereafter described by referring to the drawings.

(Embodiment 1)

FIG. 1 shows a cross-sectional view illustration of a power semiconductor device in the present embodiment. In FIG. 1, numeral 5 designates a semiconductor chip, 6 a multilayer circuit board, 7 a printed circuit board, 8 a package, 37 wires formed on the semiconductor chip, 38 an electrode layer in the multilayer circuit board, and 39 an electrode layer in the printed circuit board. In FIG. 1, the power MOSFETs are shown in equivalent circuits. In the semiconductor chip 5, there are formed power MOSFET cells that occupy an area of 2 mm$^2$ or more. N-channel power MOSFET 27 and a power MOSFET 28 are formed by a repetitive pattern of these power MOSFET cells.

In the present embodiment, the drain, gate and source of the power MOSFETs are connected to the electrode layer 38 of the multilayer circuit board 6 via drain bumps 46, gate bumps 45 and source bumps 44, respectively. It is difficult to reduce the gate resistance of the power MOSFETs that occupy large areas merely by increasing the thickness of the gate electrode layer or the metal wiring layer that are deposited on the semiconductor chip 5. In the present embodiment, two or more gate bumps 45 are formed for a single power MOSFET, and the semiconductor chip 5 and the multilayer circuit board 6 are fabricated in the same package 8, and the resistance in the gate wiring is reduced by the electrode layer 38 in the multilayer circuit board 6.

In the semiconductor device of the embodiment, the package 8 is of the BGA (Ball Grid Array) type with a bump array. The package 8 is connected to the electrode layer 39 in the printed circuit board 7. The bumps referred to herein are not bonding wires but are examples of connecting materials with electrical conductivity and adhesive properties, such as solder or gold, and their shape is not limited to that shown in FIG. 1.

In the present embodiment, gate pads are provided at two or more locations spaced apart from one another in the periphery of the gate regions in the power MOSFETs. These gate pads are connected, via the gate bumps 45, by a part of the electrode layers 38 with a thickness of 50 μm or more that is provided outside the semiconductor chip 5. Thus, in the semiconductor device of the invention, such as a BGA power 1C or a power MOSFET, the gate impedance can be significantly reduced. The other part of the electrode layers 38 are used for connecting the drain pads 46 and the source pads 45 via the drain pads 46 and source pads 44, respectively. The electrode layers 38 are further connected to the printed circuit board 7 via another bumps 11a, 13a, 14a.

Figure 2:
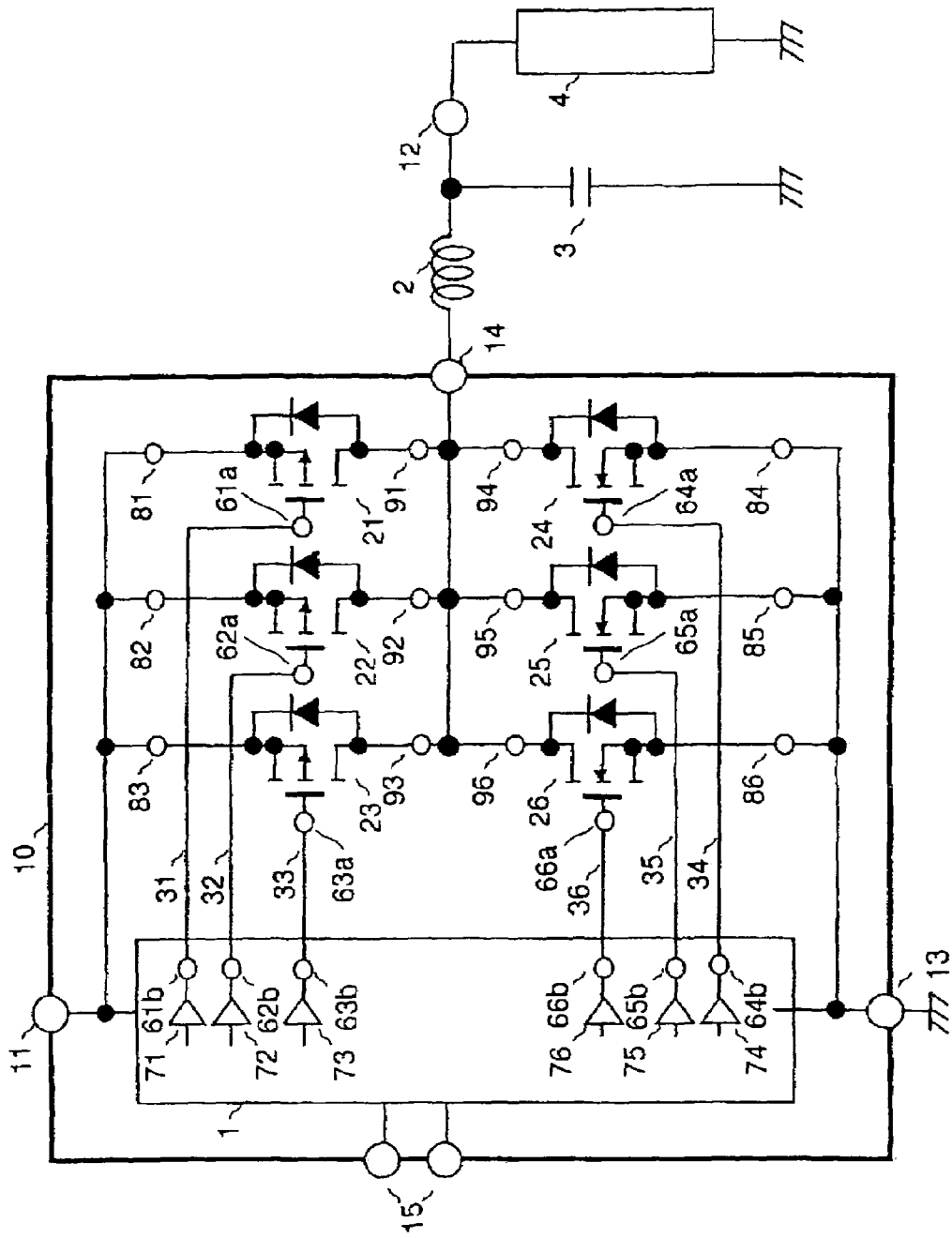
FIG. 2 shows a circuit diagram of a switching power supply utilizing the semiconductor device of Embodiment 1.

FIG. 2 shows a circuit diagram of a switching power supply utilizing the power MOSFET of the embodiment. In FIG. 2, numerals 21 to 23 designate p-channel power MOSFETs, and 24 to 26 n-channel power MOSFETs. Numeral 1 designates a control circuit portion for controlling the p-channel power MOSFETs 21 to 23 and the n-channel power MOSFETs 24 to 26 by PWM methods. Pre-drivers 71 to 76 are formed in the control circuit portion 1. Numeral 11 designates an input voltage terminal, 12 an output voltage terminal, 13 a ground terminal, 14 an intermediate-output terminal, 15 an input signal terminal, 2 an inductor, 3 a capacitor, and 4 a load. A filter for the switching power supply is formed by the inductor 2 and the capacitor 3. In the present embodiment, the individual output terminals of the pre-drivers 71 to 76 and the gate terminals of the MOSFETs are provided with electrode pads 61a to 66b. The electrode pads are connected via bumps provided thereon to the gate wires 31 to 36 in the multilayer circuit board 6 outside the semiconductor chip 5. In the present embodiment, the semiconductor chip 5 is a silicon semiconductor chip.

Figure 3:
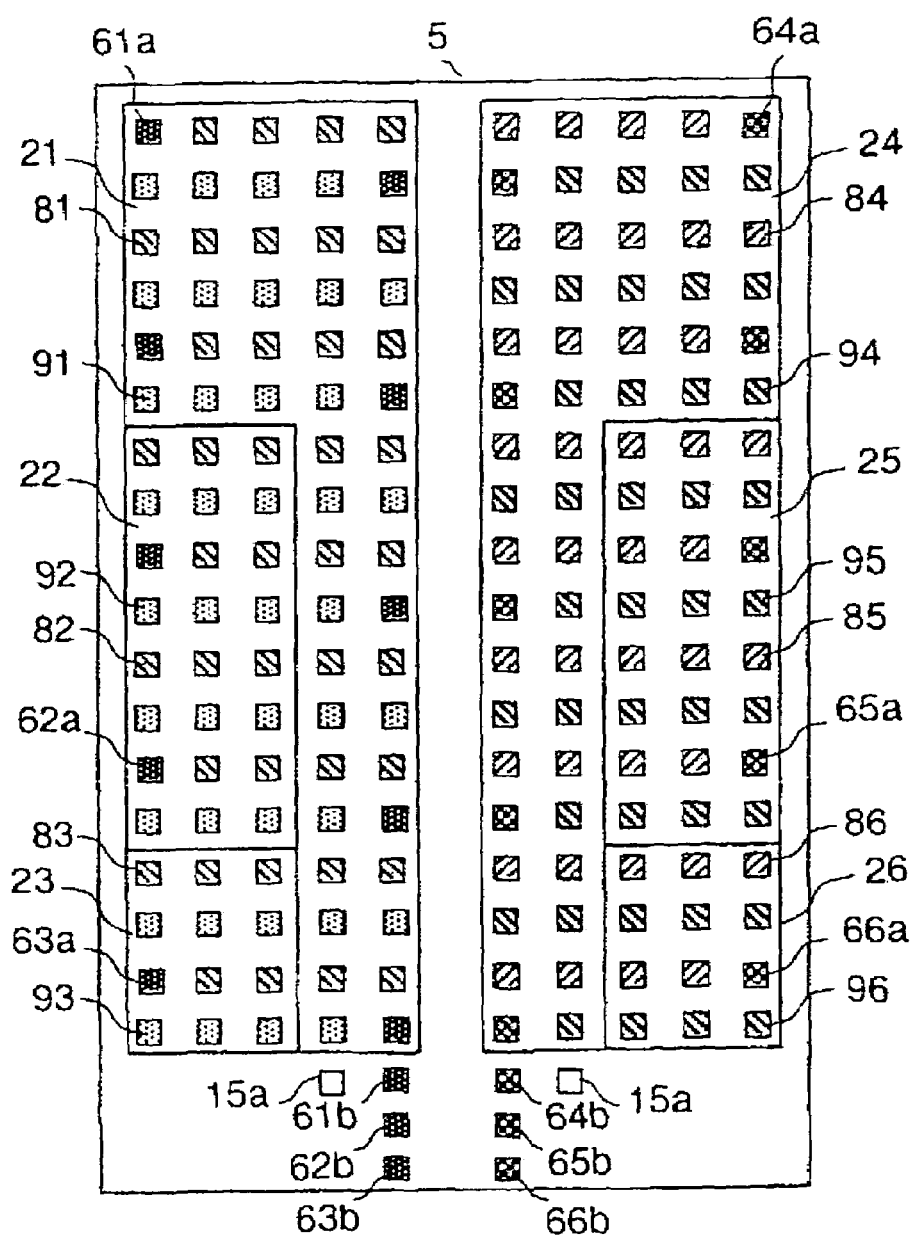
FIG. 3 shows a plan view of the power semiconductor device of Embodiment 1.

FIG. 3 shows a plan view of the semiconductor chip 5 of the embodiment. To the left side of the figure are disposed p-channel power MOSFETs 21, 22 and 23 with large, intermediate and small areas, respectively. To the right side of the figure are disposed n-channel power MOSFETs 24, 25 and 26 with large, intermediate and small areas, respectively. At the bottom of FIG. 3 is disposed the control circuit portion 1. In FIG. 3, numerals 81, 82 and 83 designate electrode pads for the sources of the p-channel power MOSFETs 21, 22 and 23. Numerals 61a, 62a and 63a designate electrode pads for the gates. Numerals 91, 92 and 93 designate electrode pads for the drains, 84, 85 and 86 electrode pads for the sources of the n-channel power MOSFETs, 64a, 65a and 66a electrode pads for the gates, and 94, 95 and 96 electrode pads for the drains. Numerals 61b to 66b designate electrode pads for the gates provided towards the control circuit 1, and numeral 15a designates electrode pads for the input signal terminals 15. These numerals correspond to those indicated in FIG. 2.

Figure 4:
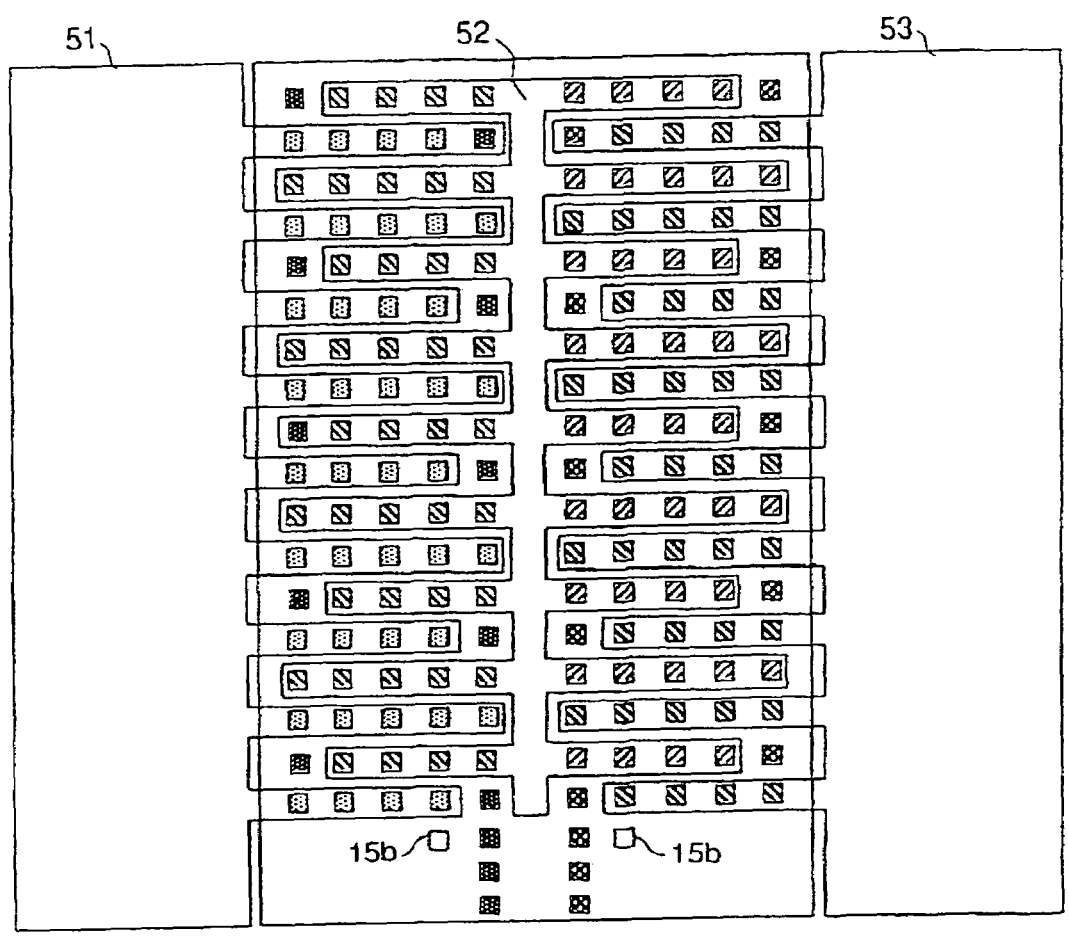
FIG. 4 shows a plan view of the first electrode layer in a multilayer circuit board in the power semiconductor device of Embodiment 1.

FIG. 4 shows a planar pattern of a first electrode layer of the multilayer circuit board 6 of FIG. 1, namely the electrode layer 38 located closest to the semiconductor chip 5. In this pattern, there are arranged a power supply electrode layer 51, an intermediate-output electrode layer 52 and a ground electrode layer 53. Electrode pads 81, 82 and 83 for the sources of the p-channel power MOSFETs 21, 22 and 23 are connected to the power supply electrode layer 51. Electrode pads 91, 92 and 93 for the drains of the p-channel power MOSFETs 21, 22 and 23 and electrode pads 94, 95 and 96 for the drains of the n-channel power MOSFETs 24, 25 and 26 are connected to the intermediate-output electrode layer 52. These electrode pads and electrode layers are connected via the source bumps 44, gate bumps 45 and drain bumps 46 shown in FIG. 1.

Figure 5:
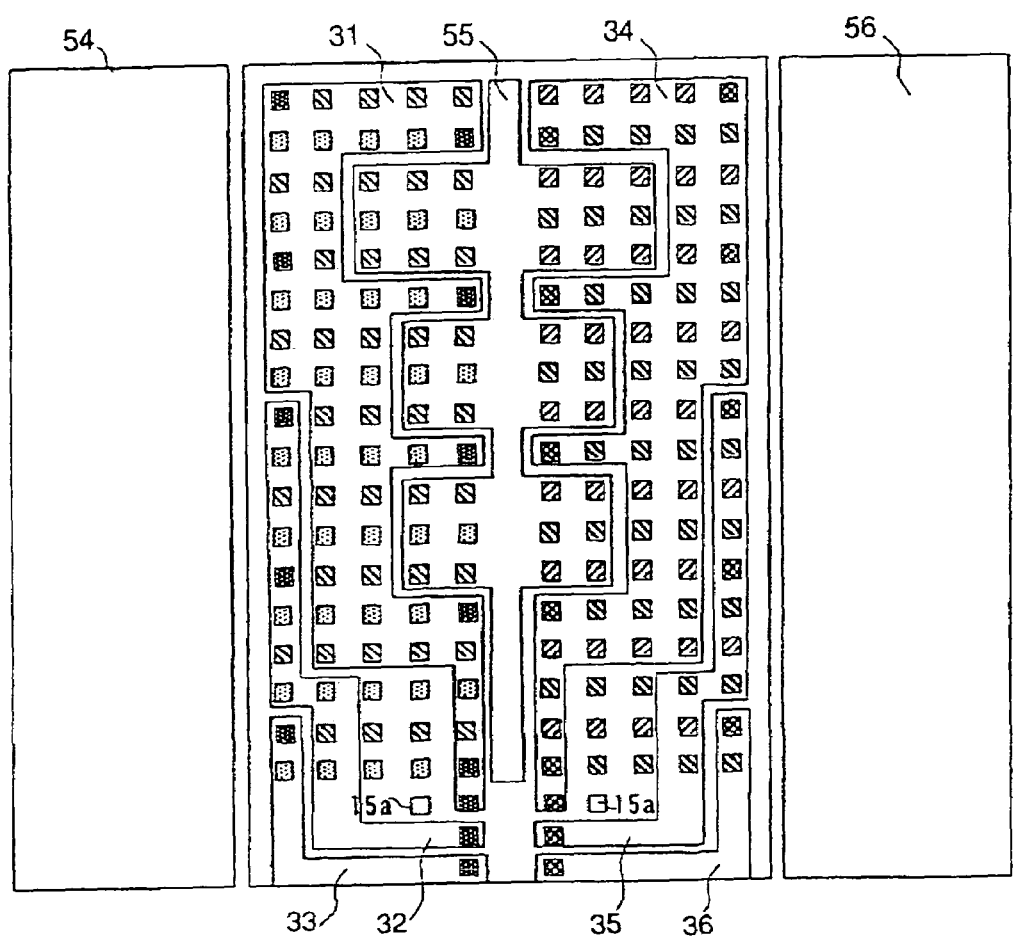
FIG. 5 shows a plan view of the second electrode layer in the multilayer circuit board in the power semiconductor device of Embodiment 1.

FIG. 5 shows a planar pattern of a second electrode layer disposed on the first electrode layer shown in FIG. 4, via an insulating layer. In the second electrode layer pattern, there are disposed the gate wires 31 to 36 and the electrode layers 54 to 56. The gate electrodes of the p-channel power MOSFETs 21, 22 and 23 are connected to the gate electrode pads 61b, 62b and 63b of the control circuit portion 1 via the gate wires 31, 32 and 33. The gate electrodes of the n-channel power MOSFETs 24, 25 and 26 are connected to the gate electrode pads 64b, 65b and 66b of the control circuit 1 via the gate wires 34, 35 and 36. The electrode layer 51 and electrode layer 54, the intermediate-output electrode layer 52 and electrode layer 55, and the ground electrode layer 53 and electrode layer 56 are also electrically connected, respectively.

Figure 6:
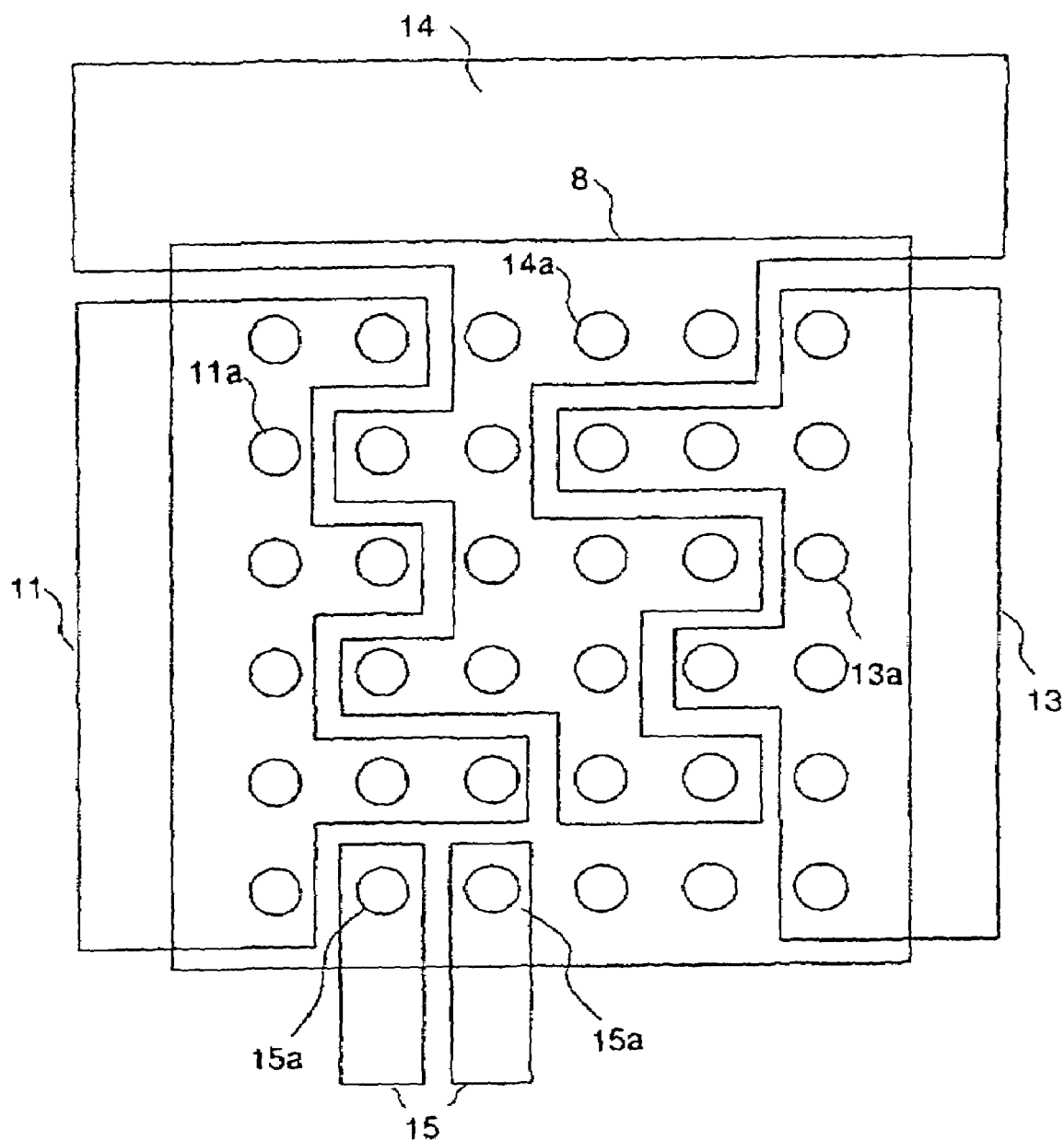
FIG. 6 shows a plan view illustrating the arrangement of bumps in the power semiconductor device of Embodiment 1.

FIG. 6 shows a plan view illustrating the arrangement of the package 8 of the BGA-type integrated circuit, input-voltage terminal bumps 11a, intermediate-output terminal bumps 14a, ground terminal bumps 13a, and electrode pads 15a.

In the present embodiment, electrode layers for the gate wires 31 to 36 with a thickness of 50 μm or more can be easily formed, so that the sheet resistance of the gate-wiring electrode layer can be reduced to 2 milliohms per square or less. Thus, when an electrode wire with a width of 200 μm is used, a 1 mm extension of the electrode wire results in an increase of only 5 mΩ or less. Thus, the wiring resistance can be greatly reduced as compared with the electrode layer formed on the semiconductor chip. Thus, the switching loss components in the power MOSFETs caused by delay due to the internal gate resistance of the power MOSFETs or the gate resistance between the power MOSFETs and their control circuit can be reduced.

Specifically, in the semiconductor device in the present embodiment, as shown in FIGS. 1 and 3, the drains, gates and sources of the power MOSFETs formed on the semiconductor chip 5 are connected to the multilayer circuit board 6 via two or more drain bumps 46 (disposed on the drain electrode pads 91, 92, 93, 94, 95 and 96), two or more source bumps 44 (disposed on the source electrode pads 81, 82, 83, 84, 85 and 86), and two or more gate bumps 45 (disposed on the gate electrode pads 61a, 62a, 63a, 64, 65a and 66a). As a result, the resistance in the gate layers provided throughout the MOSFETs can be greatly reduced.

Further, in the semiconductor device of the present embodiment, in order to reduce the impedance between the gate terminals of the power MOSFETs and the control circuit portion 1, the gate electrode pads 61a to 66a towards the power MOSFET are connected to the gate electrode pads 61b to 66b towards the control circuit portion 1 with a low impedance via the electrode layer 38 formed in the multilayer circuit board 6 outside the semiconductor chip 5. Thus, even when the power MOSFETs are driven at high frequencies of more than 3 MHz, the gate drive signal can be transmitted with low noise level and at high speed, so that erroneous operation of the power MOSFETs or increases in switching loss can be prevented. Further, the power supply efficiency of the switching power supply circuit shown in FIG. 2, in which the semiconductor device of the embodiment is used, can be improved.

In the present embodiment, three MOSFETs with small, medium and large on-resistance, respectively, are connected in parallel, both for the p-channel power MOSFETs and n-channel power MOSFETs. When a large current is supplied to the load 4, all the MOSFETs are driven, whereas when the load is light as, for example, when it is in a stand-by state, only the p-channel power MOSFET 23 and n-channel MOSFET 26 of the smallest sizes shown in FIGS. 2 and 3 are driven, while the other elements are turned off. Thus, the number of power MOSFETs that are driven is increased or decreased depending on the load current required, thereby achieving a high power supply efficiency in a wide current range. In such a circuit where the number of power MOSFETs driven is adjusted depending on the required load current, the gate wires must be extended. However, by utilizing the semiconductor device of the embodiment, the influence of gate impedance can be minimized, so that a power supply device with small loss and high efficiency can be realized.

(Embodiment 2)

Figure 7:
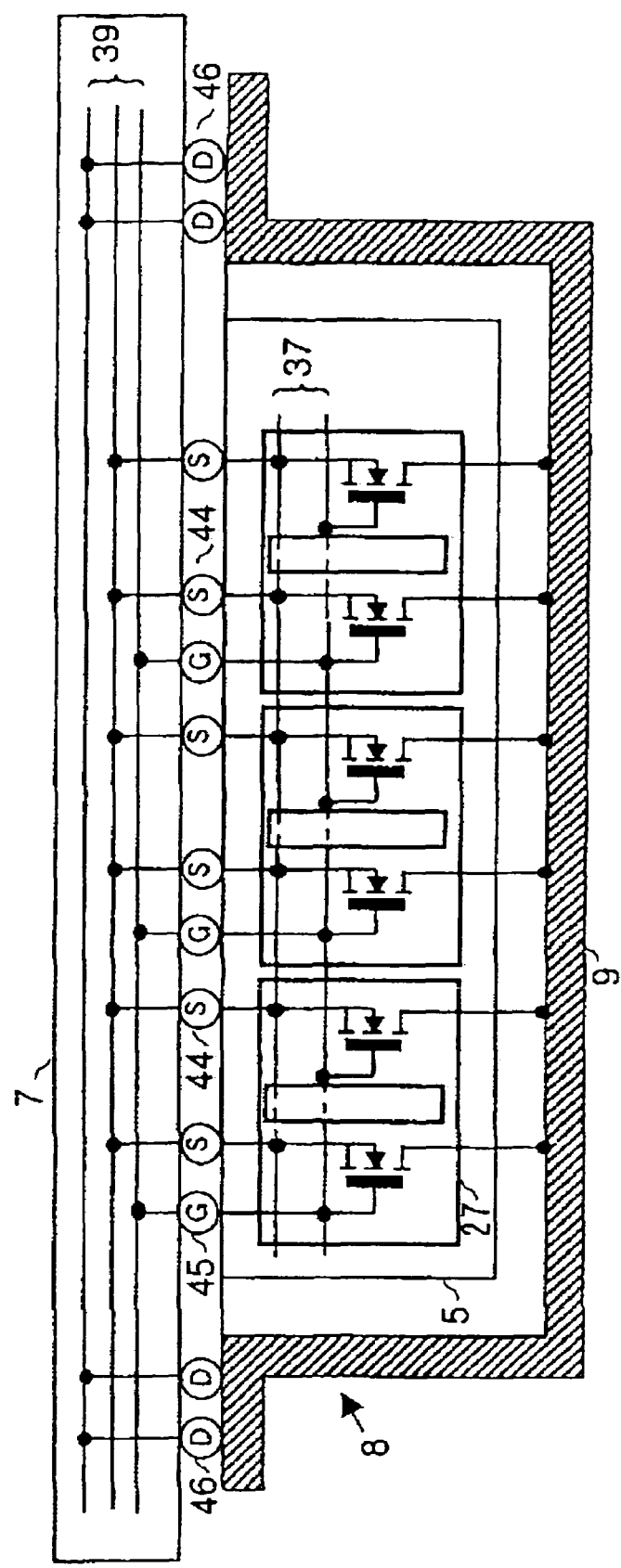
FIG. 7 shows a cross-sectional illustration view of a power semiconductor device according to Embodiment 2.

FIG. 7 shows a cross-sectional illustration view of the power semiconductor device according to Embodiment 2. This embodiment is based on a monolithic, vertical power MOSFET in which a drain electrode 9 on the back surface of the semiconductor chip 5 is connected to the printed circuit board 7 via drain bumps 46. Embodiment 2 differs from Embodiment 1 in that wiring to the electrode layer 39 on the printed circuit board 7 is achieved directly without using the multilayer circuit board 6. Further, in the present embodiment, the drain electrode 9 fabricated as part of the package 8 serves the function of the wire connecting to the drain bumps 46.

In the present embodiment, too, the gate wires are connected with low resistance via the gate bumps 45 formed on the two or more gate electrodes and the electrode layer 39 in the printed circuit board 7 outside the semiconductor chip 5. Thus, the resistance in the gate layer provided throughout the MOSFETs can be greatly reduced. As a result, the gate drive signal can be transmitted at high speed with a low noise level even when the power MOSFET is driven at high frequencies of 1 MHz or higher, thereby preventing erroneous operation or increases in switching loss. Further, by using the MOSFET according to the present embodiment, the power supply efficiency of the switching power supply circuit can be improved, as in Embodiment 1.

Figure 8:
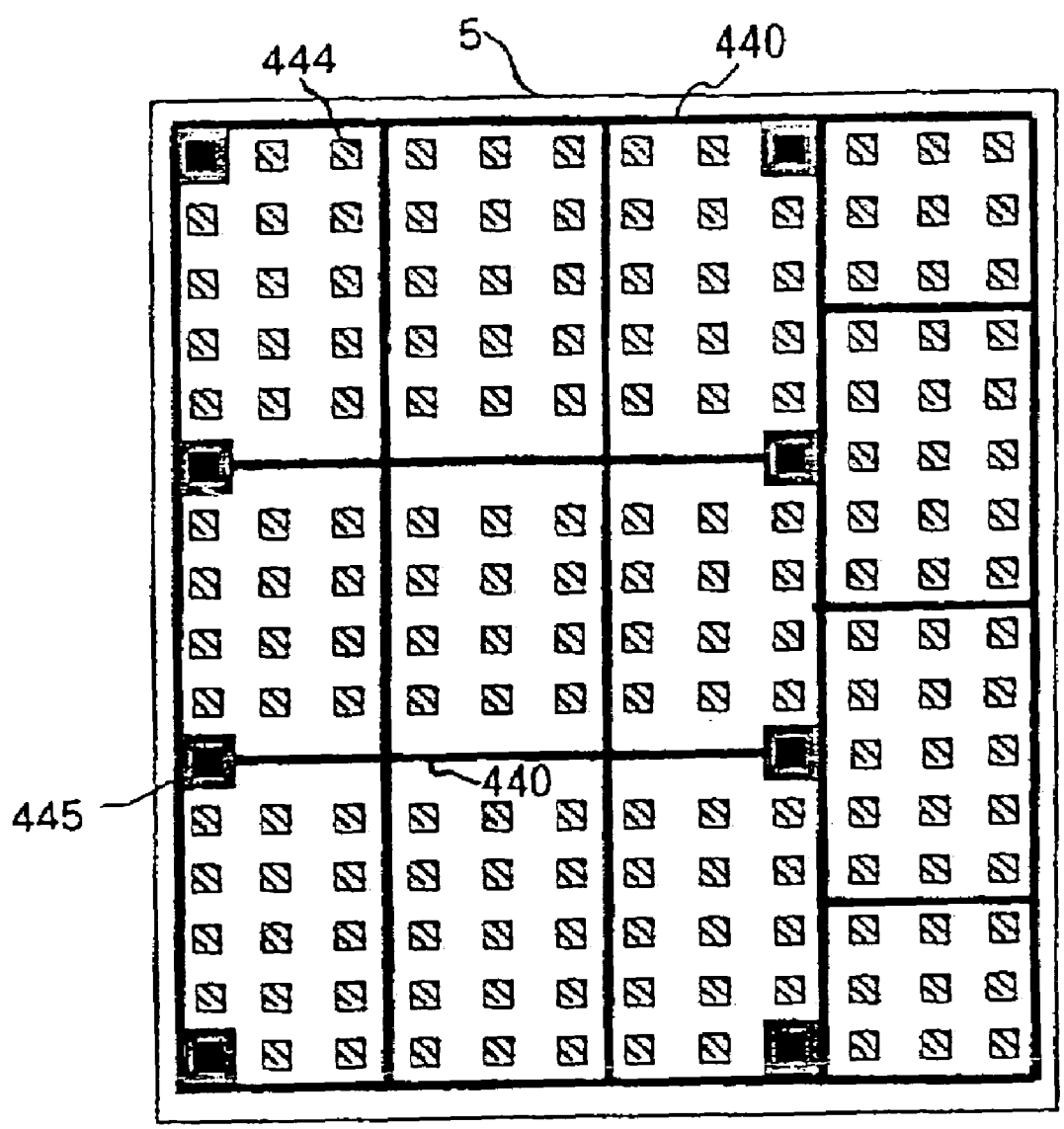
FIG. 8 shows a plan view of a semiconductor chip in Embodiment 2.
Figure 9:
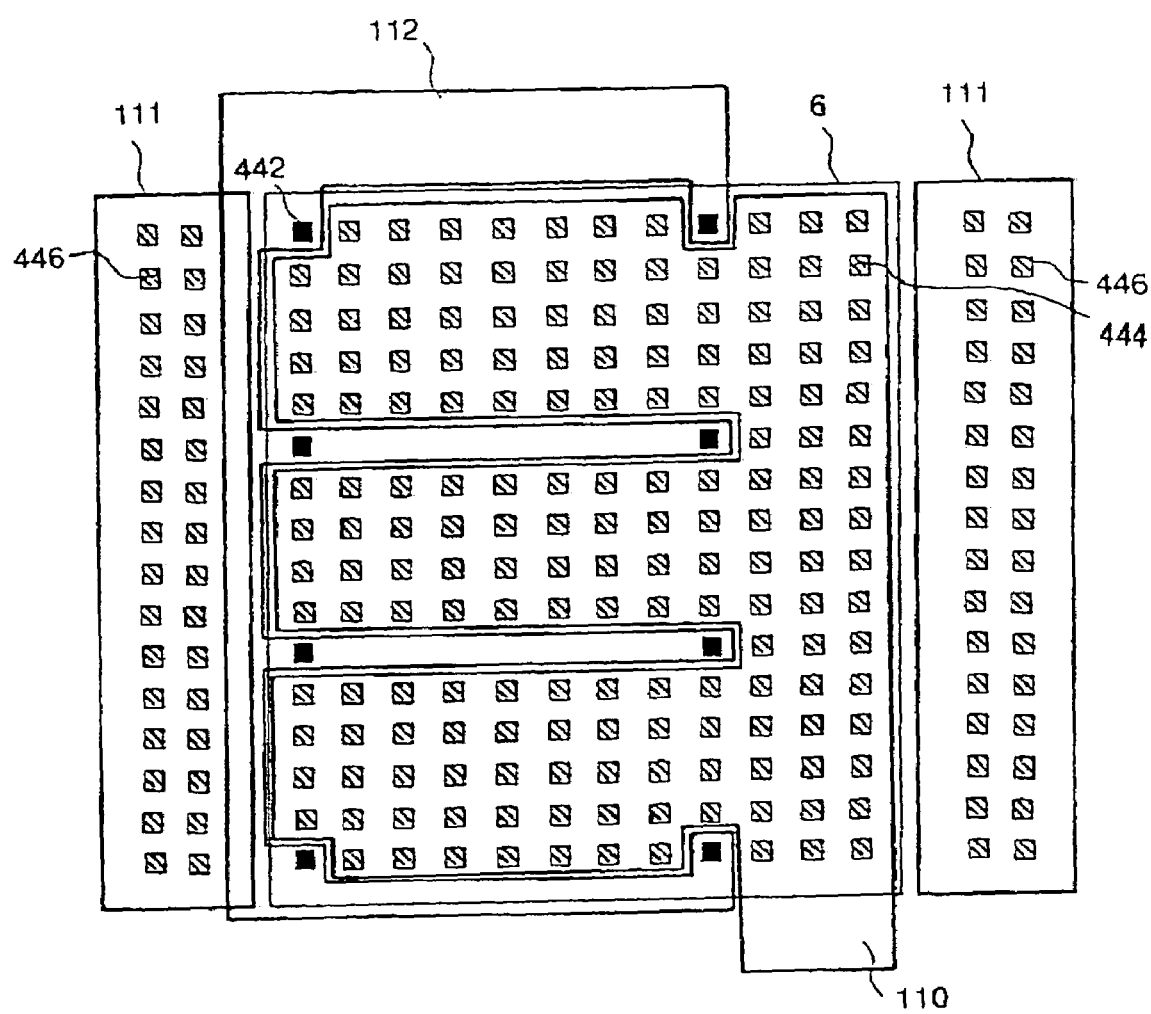
FIG. 9 shows a plan view illustrating the connections between the semiconductor chip and the printed circuit board.

FIG. 8 shows a plan view of the semiconductor chip 5 of the embodiment. Two or more gate electrode pads 445 where the gate bumps 45 are disposed are provided. In addition, gate fingers 440 for reducing the gate resistance are provided throughout the gate region such that they accommodate source electrode pads 444. Thus, in the present embodiment, a gate resistance of 0.5Ω or less can be easily achieved without silicidation or by means of a high-melting point metal gate. While in FIG. 8 the source electrode pads are entirely enclosed on all sides, enclosing on three sides would also be effective. FIG. 9 shows a plan view illustrating the connection between the printed circuit board 7 and the semiconductor chip 5. Electrode layers 110, 111 and 112 formed in the printed circuit board 7 are connected to the drain, gate and source of the power MOSFETs via drain bumps 46 on drain electrode pads 446, gate bumps 45 on gate electrode pads 442 and source bumps 44 on source electrode pads 444. The gate resistance of the power MOSFETs can be reduced to a low impedance by the gate electrode layer 112. The gate electrode layer 112 and the drain electrode layer 111 shown in FIG. 9 are separately disposed in different layers.

(Embodiment 3)

Figure 10:
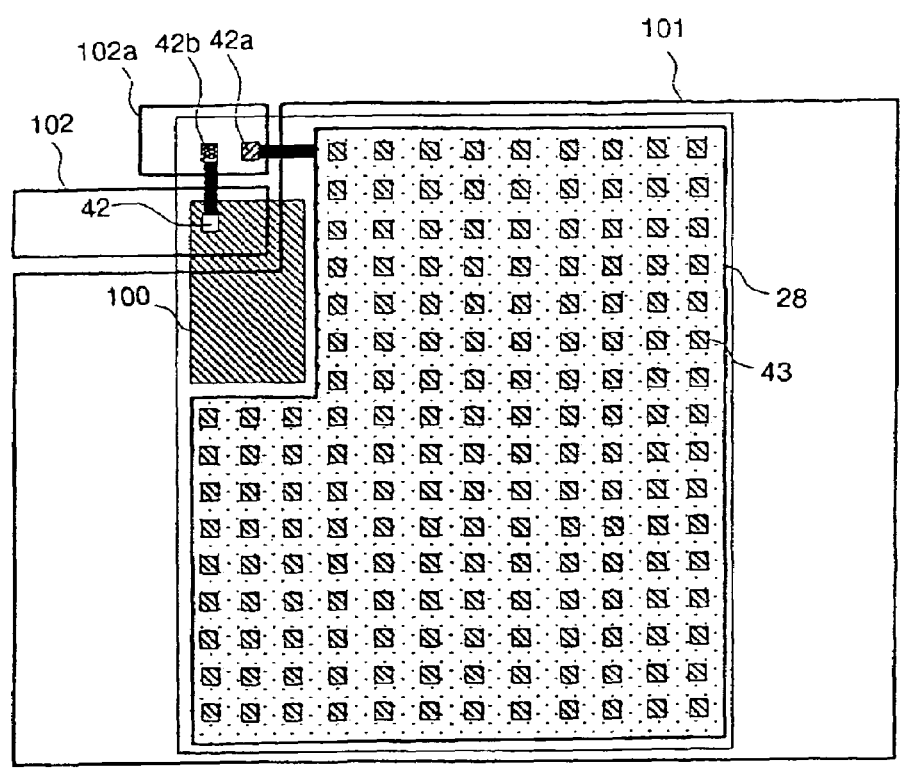
FIG. 10 shows a plan view of a power semiconductor device according to Embodiment 3.
Figure 11:
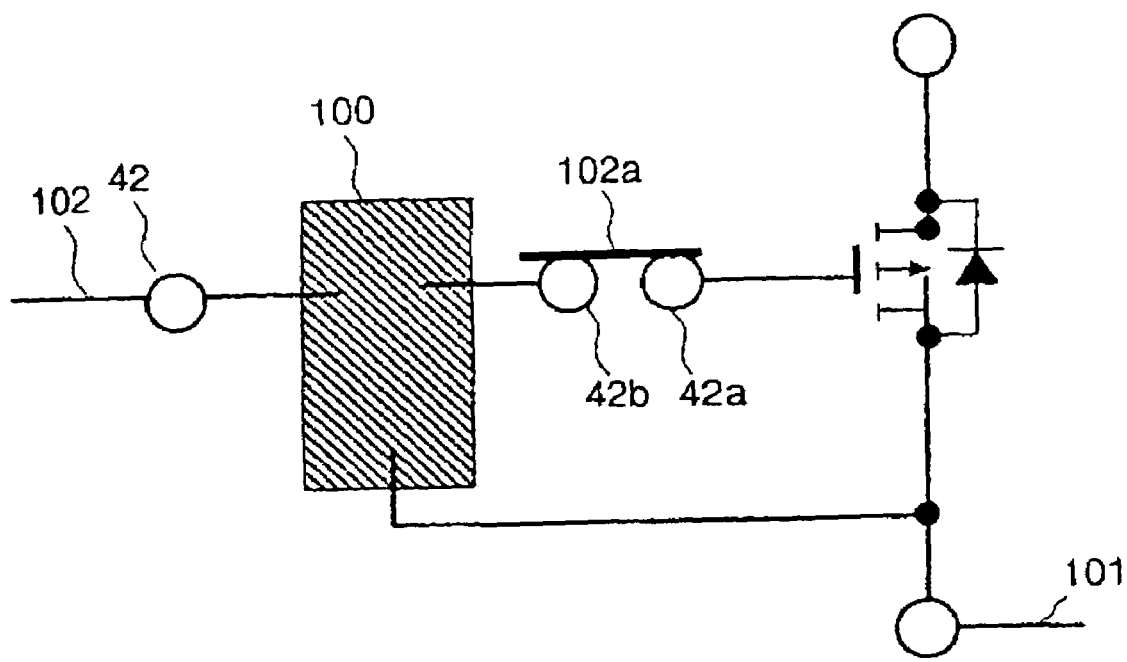
FIG. 11 shows a block circuit diagram of the power semiconductor device of Embodiment 3.

FIG. 10 shows a plan view of the power semiconductor device according to Embodiment 3. FIG. 11 shows a block circuit diagram of the power semiconductor device of Embodiment 3. In this embodiment, gate pads 42a and 42b, that are connected by the formation of the electrode layer 102a, are formed such that they are spaced apart from one another. The gate pad 42a is connected to the gate layer via wiring in the silicon chip of the power MOSFET 28, while the gate pad 42b is connected to the control circuit portion 100 for the power MOSFET 28.

In the present embodiment, while a gate pad 42 is provided for the external gate terminal, the gate pad 42 and the gate pad 42b may be commonly fabricated depending on the circuit design of the control circuit portion 100. In this embodiment, before completing connections for the gate pads 42a and 42b using the electrode layer 102a, a gate-to-source breakdown voltage can be measured on the power MOSFET 28 using the gate pad 42a, for screening purposes. After examining the gate-to-source breakdown characteristics of the power MOSFET 28, for example, the printed circuit board 7 on which the electrode layers 101, 102 and 102a are disposed is disposed. Thus, the signal applied to the electrode layer 102 is transmitted to the gate of the power MOSFET 28 via the bumps formed on the gate pads 42, 42a and 42b and via the electrode layers 102a and 102.

Thus, a screening of the gate-to-source breakdown characteristics, which the prior art has not been able to carry out due to the provision of the control circuit portion 100, can be performed. Further, as the gate pads 42a and 42b are connected using bumps, fewer limitations are imposed on the location for disposing the gate pads than there are in methods whereby the gate pads 42a and 42b are connected using bonding wires.

While the present embodiment has been described with reference to the semiconductor device in which the back surface of the semiconductor chip was the drain of the power MOSFET, it goes without saying that the invention is also effective in integrated circuit devices with power MOSFETs in which the drain pads are provided on the surface of the semiconductor chip.

This embodiment can be combined with the technologies described in the embodiment 1 and/or the embodiment 2. The on-state resistance and gate resistance of the power MOSFET can be reduced using these technologies. While preferred embodiments of the invention have been described using specific terms, such description is for illustrative purposes only, and it is to be understood that changes and variations may be made without departing from the spirit of the invention. For example, while in the above descriptions bumps are used as the means of connecting the semiconductor chip and the wiring outside the chip, in order to avoid the large inductance and complications in the wiring that are caused by the conventional bonding wires, means with similar effects to those of the bumps, such as conductive bonding material, may be used.

Further, the transistors are not limited to power MOSFETs but may be junction field effect transistors, SITs or MESFETs. While the above descriptions were mainly concerned with the case where the invention is applied to a DC/DC power converter, they were for illustrative purposes only. Therefore, the invention can be applied to other types of power circuits, such as a power amplifier for mobile phones, for example.

Thus, in accordance with the invention, a power MOSFET with low capacitance, low on-resistance and low parasitic inductance can be easily realized. Accordingly, the efficiency of power supply devices utilizing such power MOSFET can be improved.

What is claimed is:

1. A power semiconductor device comprising a semiconductor chip in which a first main electrode, a second main electrode and a control electrode are formed, wherein a plurality of control electrode pads are provided on said semiconductor chip, said plurality of control electrode pads being disposed within the periphery of a gate area of said power semiconductor device, wherein said plurality of control electrode pads are connected to an electrode layer disposed outside said semiconductor chip via a conductive bonding member; and an active area of said power semiconductor device is formed between those of said plurality of control electrode pads of said power semiconductor device that are spaced apart from one another the most.

2. The power semiconductor device according to claim 1, wherein said semiconductor chip comprises a first main surface and a second main surface, wherein said control electrode pads are disposed on said first main surface and said second main electrode is formed on said second main surface.

3. A power semiconductor device comprising a semiconductor chip in which a first semiconductor area forming a first main electrode, a second semiconductor area forming a second main electrode and a control electrode area forming a control electrode are formed, wherein:

a planar pattern is formed in said power semiconductor device, said planar pattern comprising a repetition of unit patterns made up of said first semiconductor area, said second semiconductor area and said control electrode area, wherein said first semiconductor area in the repeating planar pattern is connected to a plurality of first main electrode pads, said control electrode area are connected to a plurality of control electrode pads, and said second semiconductor area is connected to a plurality of second main electrode pads, wherein said first main electrode pads are connected via a plurality of conductive bonding members to a metal electrode layer disposed outside said semiconductor chip, and wherein said second main electrode pads are connected via another plurality of conductive bonding members to another metal electrode layer; and an active area of said power semiconductor device is formed between those of said plurality of control electrode pads of said power semiconductor device that are spaced apart from one another the most.

4. The power semiconductor device according to claim 3, wherein said metal electrode layers and separated each other electrically, whereas they are formed on a same layer.

5. The power semiconductor device according to claim 3, wherein said control electrode area is connected via a first control-area conductive bonding member to a control-area metal layer disposed outside said semiconductor chip, and wherein the control-area metal layer is extended over its active area and connected to a second control-area conductive bonding member spaced from said first control-area conductive bonding member.

6. The power semiconductor device according to claim 3, wherein said semiconductor chip is a silicon semiconductor chip.

7. The power semiconductor device according to claim 3, wherein said semiconductor device is a power MOSFET in which said first main electrode is the source electrode, said second main electrode is the drain electrode, and said control electrode is the gate electrode of said power MOSFET.

8. A power semiconductor device comprising a power semiconductor device formed in a semiconductor chip, said power semiconductor device comprising a first control electrode pad for an external electrode, a second control electrode pad disposed away from said first control electrode pad, and a gate control circuit for said power semiconductor device, said gate control circuit being disposed between said first control electrode pad and the source of said power transistor, wherein said second control electrode pad is connected to the gate of said power transistor, and wherein said first control electrode pad is connected to said second control electrode pad via a conductive bonding member, and an active area of said power semiconductor device is formed between those of said plurality of control electrode pads of said power semiconductor device that are spaced apart from one another the most.

9. The power semiconductor device according to claim 8, further comprising an external control-electrode pad, wherein a control circuit for said power transistor is provided between said external control-electrode pad and said first control electrode pad, and wherein said first control electrode pad is connected to said second control electrode pad via a conductive bonding member.

10. A power semiconductor device comprising plurality of control electrode pads for the power semiconductor device formed within a semiconductor chip, wherein the control electrode pads are distributed within the periphery of the gate area, and an active area of said power semiconductor device is formed between those of said plurality of control electrode pads of said power semiconductor device that are spaced apart from one another the most.

11. The power semiconductor device according to claim 10, wherein the control electrode pads are connected via bumps or conductive bonding material to an electrode layer disposed outside the semiconductor chip.

12. A power semiconductor device, comprising a semiconductor chip for which a plurality of power transistors with a plurality of pads for controlled electrodes of the semiconductor device, a first electrode layer disposed outside said semiconductor chip, said first electrode layer is contacted to said pads with conductive bonding materials;

wherein an active area of said power semiconductor device is formed between those of said plurality of pads for controlled electrodes of said power semiconductor device that are spaced apart from one another the most.

13. The power semiconductor device according to claim 12, said plurality of power transistors including a plurality of pads for source and/or drain electrodes of the semiconductor device, second electrode layers different from said first electrode layer disposed outside said semiconductor chip, said second electrode layers is contacted to said pads for source and/or drain electrodes of said power semiconductor device with conductive bonding materials.

* * * * *